United States Patent [19]

Tanaka et al.

[11] Patent Number: 5,026,143

[45] Date of Patent: Jun. 25, 1991

[54] ACTIVE TYPE LIQUID CRYSTAL MATRIX DISPLAY HAVING SIGNAL ELECTRODES WITH EXPANDED SECTIONS AT GROUP EXPOSURE BOUNDARIES

[75] Inventors: Hirohisa Tanaka, Gose; Kohhei Kishi, Nara; Kohzo Yano, Yamatokoriyama, all of Japan

[73] Assignee: Sharp Kabushiki Kaisha, Osaka, Japan

[21] Appl. No.: 395,187

[22] Filed: Aug. 17, 1989

Related U.S. Application Data

[63] Continuation of Ser. No. 825,924, Feb. 4, 1986, abandoned.

[30] Foreign Application Priority Data

Feb. 6, 1985 [JP] Japan .................................. 60-22196

[51] Int. Cl.$^5$ .............................................. G02F 1/133
[52] U.S. Cl. ..................................... 350/336; 350/334; 350/333
[58] Field of Search .................... 350/333, 334, 336; 357/23.7, 32, 68, 45; 340/789, 719; 437/204, 205

[56] References Cited

U.S. PATENT DOCUMENTS

| | | | |
|---|---|---|---|
| 3,861,783 | 1/1975 | Dill et al. | 350/334 |
| 4,103,297 | 7/1978 | McGreivy et al. | 350/334 |
| 4,112,333 | 9/1978 | Asars et al. | 350/333 |
| 4,176,917 | 12/1979 | Yasutake | 350/336 |
| 4,242,698 | 12/1980 | Ghate et al. | 357/68 |
| 4,630,355 | 12/1986 | Johnson | 350/333 |
| 4,660,935 | 4/1987 | Iwashita et al. | 350/336 |
| 4,668,972 | 5/1987 | Sato et al. | 357/68 |
| 4,687,299 | 8/1987 | Yamada | 350/336 |
| 4,721,365 | 1/1988 | Nishimura | 350/336 |
| 4,723,837 | 2/1988 | Masubuchi | 350/334 |
| 4,762,398 | 8/1988 | Yasui et al. | 350/334 |

FOREIGN PATENT DOCUMENTS

| | | | |
|---|---|---|---|
| 0124677 | 9/1979 | Japan | 357/70 |
| 0112050 | 7/1982 | Japan | 357/68 |
| 0119850 | 7/1984 | Japan | 357/68 |
| 0136509 | 4/1985 | Japan | 357/330 |
| 0097325 | 5/1985 | Japan | 340/784 |
| 0167361 | 8/1985 | Japan | 357/45 |
| 2122809 | 1/1984 | United Kingdom | 357/45 |

OTHER PUBLICATIONS

Tuan, H. C., "Amorphous Silicon Thin Film Transistor and Its Applications to Large-Area Electronics", pp. 247–257, 1984, Mat. Res. Soc. Sym. Proc., Vol. 23.

*Primary Examiner*—Stanley D. Miller
*Assistant Examiner*—Tai Van Duong

[57] ABSTRACT

An active liquid crystal matrix display panel has a plurality of display-driving circuit elements arranged in a matrix on one of the cell substrates, the circuit elements being interconnected by bus-bars. The circuit elements are produced by a group exposure method. The bus-bars are formed wider at the group exposure boundaries so as to ensure continuity of the bus-bars.

16 Claims, 4 Drawing Sheets

ACTIVE TYPE LIQUID CRYSTAL MATRIX DISPLAY HAVING SIGNAL ELECTRODES WITH EXPANDED SECTIONS AT GROUP EXPOSURE BOUNDARIES

This application is a continuation of application Ser. No. 825,924, filed on Feb. 4, 1986, now abandoned.

BACKGROUND OF THE INVENTION

1. Field of the Invention

The present invention relates to an active type liquid crystal matrix display panel incorporating switching elements such as thin film transistors (hereinafter referred to as TFT's) and more specifically to the structure of a liquid crystal display TFT array substrate in which bus-bars interconnect the electrodes of the switching elements without breakage or deficiency when a large area TFT is formed by group exposure on a cell substrate of the display panel.

2. Description of the Prior Art

The structure and manufacturing process of the conventional typical TFT-loaded cell substrate for a display panel are described below with reference to FIGS. 1 and 2. FIG. 1 is a sectional view of an essential part of the conventional TFT structure and FIG. 2 is a plan view of the TFT structure of FIG. 1. A gate electrode 2, a gate insulating film 3 and a semiconductor layer 4 are sequentially deposited on an insulating substrate 1 which also serves as a display cell substrate, and a source electrode 5 and a drain electrode 6 are formed on the semiconductor layer 4, so as to manufacture a TFT. The drain electrode 6 is connected to a display picture element electrode 7.

The TFT's with the above structure are normally arranged in a matrix on the cell substrate to produce a liquid crystal display cell. The TFT's are connected to a driving circuit to serve as switching elements of a liquid crystal X-Y matrix display panel, controlling power supply to each picture element electrode 7. With the above construction, in order to realize a liquid crystal display panel with good matrix display characteristic and uniform contrast for all picture elements, it is required to manufacture a TFT array substrate in which the TFT's have good and uniform characteristics. Meanwhile, in order to obtain a picture having high resolution and a bright pattern over a large display area, it is necessary to form multiple small TFT's over the entire display area. For this purpose, photolithography for patterning a large area thin film with a good accuracy is normally required demanded. However, as a thin film area becomes larger, the accuracy in resist patterning using a photo mask and a mask aligner is poorer and accurate patterning of the thin film is more difficult. As the accuracy of the pattern thin film deteriorates the amount of overlay between the gate electrodes and source/drain electrodes fluctuate, resulting in variable capacities between the gate electrodes and source/drain electrodes. Large position deviation cause offset between the gate electrodes and the source/drain electrodes, deteriorating TFT characteristics. For highly accurate patterning of TFT-loaded large area display region, a group exposure method has been proposed in which the TFT's in the display region are divided into a plurality of groups and patterns are formed sequentially by group. In this group exposure method, however, each pattern can deviate with respect to the others at the group boundaries, causing mismatching between bus-bars in connecting the gate electrodes in the X-direction and the source electrodes in the Y-direction of the patterns. This results in partially narrow or broken bus-bars.

The bus-bars for transmitting signals to the gate and source electrodes in the each TFT element are aligned in X- and Y-directions along the gaps between the TFT's in a matrix. Each bus-bar must be a straight strip for interconnecting the gate electrodes on the same line or the source electrodes in the same row at a time. When the gate electrode bus-bars and source electrode bus-bars are formed by patterns using a group exposure method with positive resists, mismatching between the bus-bars tends to occur at the group exposure boundaries as shown in FIG. 3. Then, the bus-bars become narrower at the boundaries. If deviation between the bus-bars is excessive, connection between the bus-bars is broken. In fact, the boundaries of two adjacent exposure groups overlap each other, so that each group boundary is subjected to exposure two times. In actual group exposure, therefore, the bus-bars deviate from each other leaving a narrowed connecting portion 40 shown in FIG. 4.

OBJECTS AND SUMMARY OF THE INVENTION

Objects of the Invention

In view of an foregoing, it is the object of the present invention to provide a liquid crystal display panel containing a highly reliable TFT array substrate formed by group exposure using technological means to eliminate defective connections between the bus-bars.

Other objects and further scope of applicability of the present invention will become apparent from the detailed description given hereinafter. It should be understood, however, that the detailed description and specific examples, while indicating preferred embodiments of the invention, are given by way of illustration only; various changes and modifications within the spirit and scope of the invention will become apparent to those skilled in the art from this detailed description.

SUMMARY OF THE INVENTION

To achieve the above object, according to an embodiment of the present invention, each bus-bar is formed wider at the group exposure boundary to secure electrode connection for proper supply of operation signals to multiple display-driving circuit elements on the cell substrate of a liquid crystal display and for a highly reliable display pattern with a uniform contrast over the entire area of the wide display region.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

Figure 1:
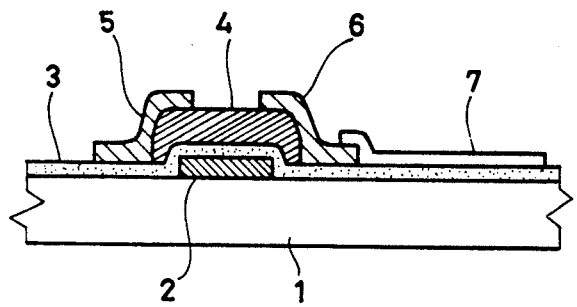
FIG. 1 is a sectional view of an essential part of the conventional TFT array substrate.
Figure 2:
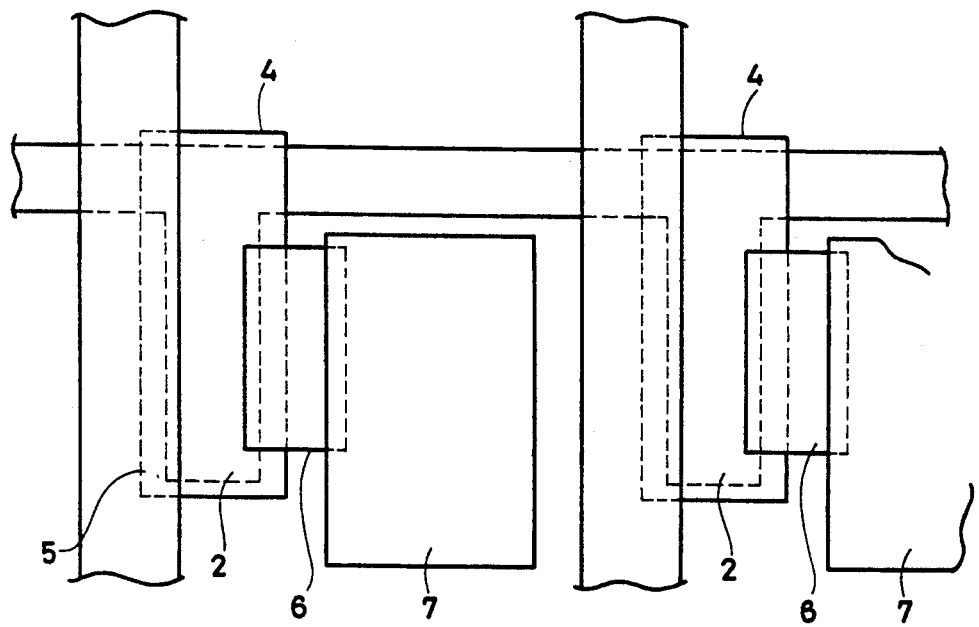
FIG. 2 is a plan view of an essential part of the conventional TFT array substrate of FIG. 1.
Figure 3:
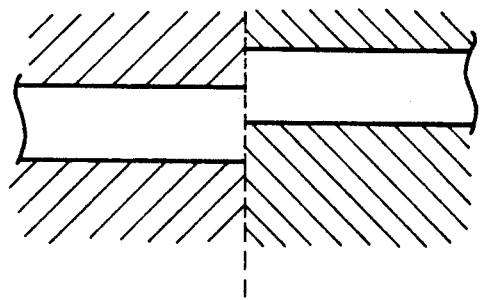
FIG. 3 is a schematic plan view for explaining a bus-bar connection in the conventional TFT array substrate.
Figure 4:
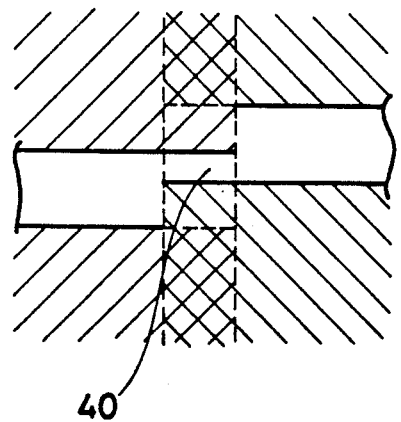
FIG. 4 is a schematic plan view showing a bus-bar connection in the conventional TFT array substrate.
Figure 5:
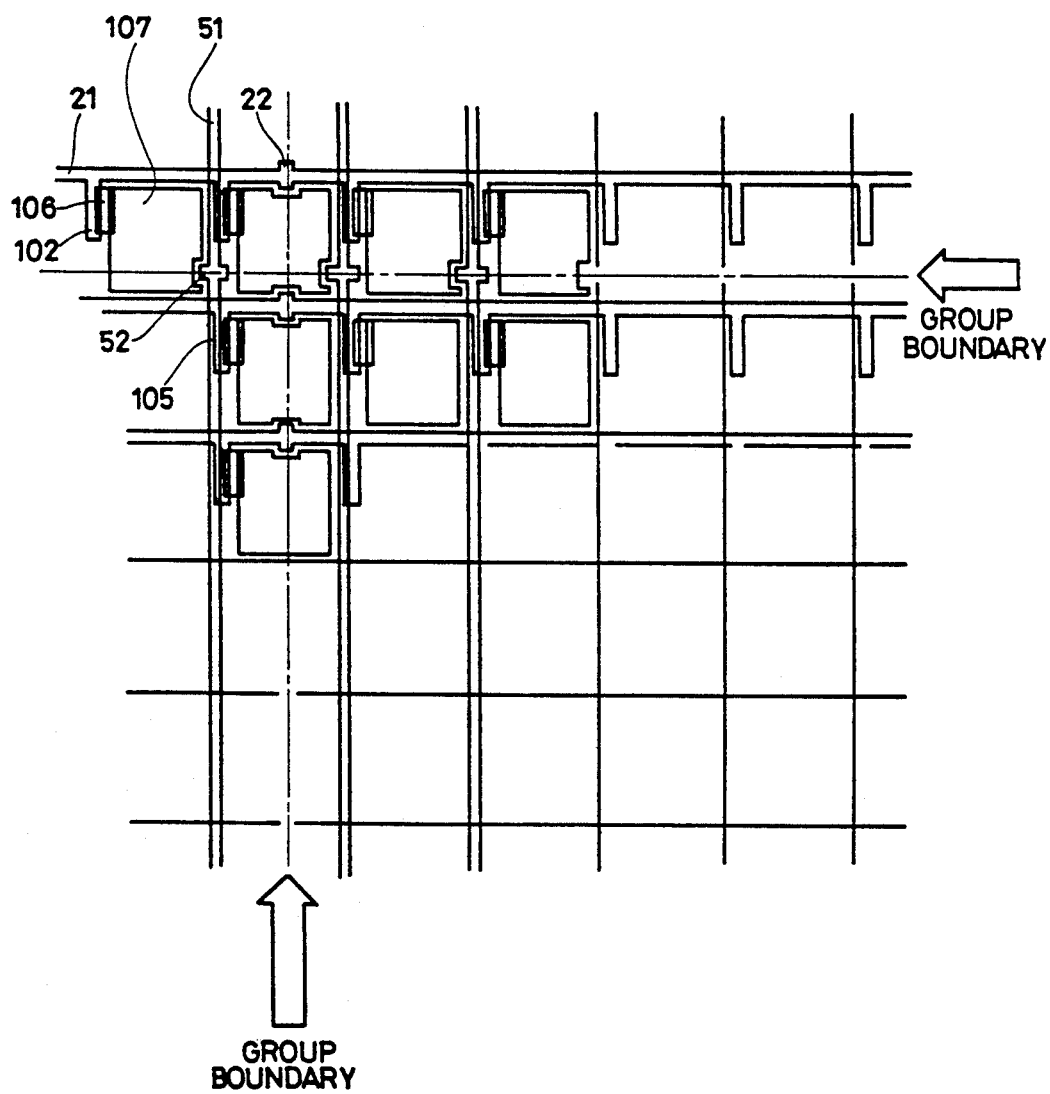
FIG. 5 is a plan view of an essential part of an embodiment of a TFT array substrate of the present invention.
Figure 6:
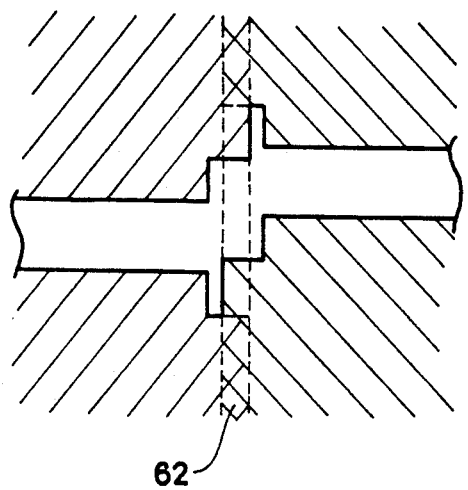
FIG. 6 is an enlarged schematic plan view showing a bus-bar connection in the TFT array substrate of FIG. 5.

FIG. 5 is a plan view of an essential part of an embodiment of a TFT array substrate of the present invention. In this figure, a TFT array of normal alignment is formed on an insulating substrate of a material such as glass or ceramic. Picture element electrodes 107 each connected to the drain electrode 106 of the each of TFTs, are arranged in an X-Y matrix on the insulating substrate so as to constitute picture elements of a matrix display. Gate electrode bus-bars 21 are arranged in the X direction so that gate electrodes 102 of TFTs on the same line are connected together by each of the gate electrode bus-bars 21. Source electrode bus-bars 51 are arranged in the Y direction so that source electrodes 105 of TFTs in the same row are connected together by each of the source electrode bus-bars 51. Each gate electrode bus-bar 21 has small expanded portions 22 at positions corresponding to the group boundaries of the TFT pattern divided in group exposure. Similarly, each source electrode bus-bar 51 has small expanded portions 52. The expanded portions 22 and 52 serve as connecting pads for joints between bus-bars 21 and 51 respectively of the exposure groups. FIG. 6 shows the detail of the connection between bus-bars 21 and 51. Even if the pattern for a bus-bar 21, 51 is formed at a different position in one exposure group from that of another group, the expanded portion 22, 52 of the bus-bar 21, 51 overlaps with that of the other bus-bar 21, 51 in the superposed boundary 62, constituting a connecting pad. The connecting pad thus formed prevents a narrower portion of the bus-bar 21, 51 from being generated by a deviated connection between bus-bars. The expanded portions 22 and 52 of bus-bars 21 and 51 respectively are formed simultaneously with the bus-bar patterns by using an exposure mask. The dimensions of the expanded portions 22, 52 are determined appropriately according to the matching accuracy between bus-bar patterns produced by group exposure. The group exposure boundary is desirably set at a position not to divide the TFT. Therefore, the expanded portions 22, 52 are positioned remote from the TFT. Furthermore, each picture element electrode 107 includes cut-away portions at the edges to avoid contact with the expanded portions 22, 52. The cut-away portion, which is negligibly small compared with the total area of each picture element electrode 107, does not have influence on the display pattern.

Figure 7:
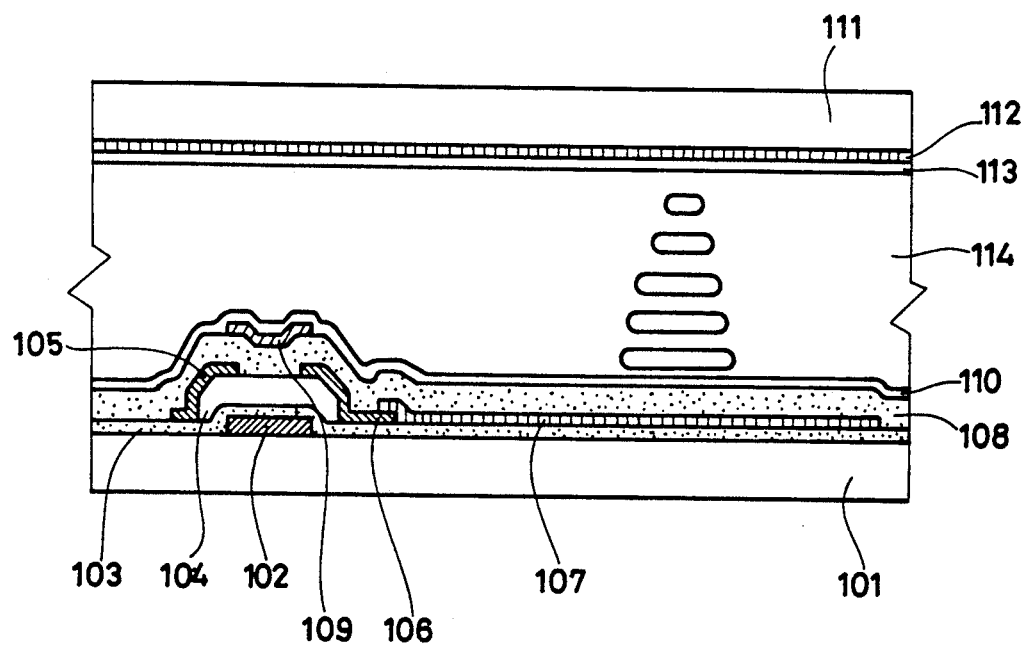
FIG. 7 is an enlarged sectional view of an essential part of an embodiment of a liquid crystal matrix display panel employing the TFT array substrate of FIG. 5.

FIG. 7 is a sectional view of an essential part of an embodiment of a transmission liquid crystal matrix display panel employing the TFT array substrate described above. The TFT is manufactured by sequentially depositing a gate electrode 102 made of Al, a gate insulating film 103 made of $Si_3N_4$ and a semiconductor layer 104 made of amorphous silicon on a photo-transmitting insulating substrate 101 made of a material such as glass or transparent plastic and superposing an aluminum source electrode 105 and a drain electrode 106 on both lateral end portions of the semiconductor layer 104. The drain electrode 106 is connected with a picture element electrode 107 composed of a transparent conducting film (I.T.O.). As shown in FIG. 5, TFTs and picture element electrodes 107 are arranged in a matrix on the insulating substrate 101, the gate electrodes of the TFT's on the same line in the X direction are interconnected together by bus-bars 21 including expanded portions 22, the source electrodes 105 of the TFT's in the same row in the Y direction are interconnected together by bus-bars 51 including expanded portions 52. To prevent deterioration by contact with the liquid crystal material, a $Si_3N_4$ protective film 108 and a rubbed $SiO_2$ orientation layer 110 that governs the orientation of liquid crystal molecules are deposited over the TFT and the picture element electrode 107. An aluminum light shield layer 109 is inserted in the interface between the protective film 108 and the orientation layer 110 at the position directly over the semiconductor layer 104, for preventing variation in TFT characteristics due to light irradiation onto the semiconductor layer 104. An opposing electrode 112 consisting of a transparent conducting film and a $SiO_2$ orientation layer 113 are laid on the inside of another light-transmitting insulating substrate 111 which constitutes a cell substrate of a liquid crystal display cell together with the insulating substrate 101. Twisted nematic liquid crystal 114 is sealed between the two orientation layers 110, 113. The bus-bar 21 for the gate electrode 102 and the bus-bar 51 for the source electrode 105 are connected to an external driving circuit for controlling the switching operation of the TFT. The opposing electrode 112 is also connected to the external driving circuit so as to apply an electric field to the liquid crystal 114 between the opposing electrode 112 and the picture element electrode 107 connected to the TFT. The embodiment of a liquid crystal display panel of the present invention has the construction as described above.

The bus-bars for supplying operation signals to the TFTs are connected with each other through connecting pads, so that they have no narrower portions which cause interruption of operation signals or broken bus-bars. Consequently, all the TFTs are securely fed with the necessary operation signals. As a result, the TFTs have a uniform operation characteristic over the entire large area of the display region, thus effecting a display pattern of a higher quality.

In the above embodiment, expanded portions are formed on the bus-bars of each TFT to serve as connecting pads for the bus-bars. The present invention is not limited to the above. It may be applied to bus-bars in MOS.FET or MIM displays in which multiple circuit elements are arranged.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A liquid crystal matrix display panel comprising:
   a first substrate;
   TFT transistors formed on said first substrate;
   said TFT transistors being arranged in a matrix, each TFT transistor including a source electrode, a gate electrode and a drain electrode;
   picture element electrodes formed on said first substrate, said picture element electrodes being arranged in a matrix, each picture element electrode being connected to a corresponding one of said drain electrodes;

gate electrode bus-bars formed on said first substrate for electrically interconnecting said gate electrodes of said TFT transistors aligned in one direction of said matrix;

source electrode bus-bars formed on said first substrate for electrically interconnecting said source electrodes of said TFT transistors aligned in the other direction of said matrix;

said TFT transistors, said gate electrode bus-bars, and said source electrode bus-bars being divided into a plurality of groups formed on said first substrate by a group photolithography exposure method, each group being a sub-matrix of said matrix;

said gate electrode bus-bars and said source electrode bus-bars having wider sections at boundaries of said groups, said boundaries being located between respective transistors of adjacent groups to form an electrical connection between like bus-bars of adjacent groups, each wider section having a portion which overlaps a portion of an adjacent wider section to form said electrical connection between like bus-bars of adjacent groups;

a second substrate; and a liquid crystal composition disposed between said first and second substrates.

2. The liquid crystal matrix display panel as claimed in claim 1, wherein said wider sections form only a single planar interface between like electrode bus-bars of adjacent groups such that said planar interface is parallel to the surface of said first substrate.

3. The liquid crystal matrix display panel as claimed in claim 1, wherein said wider sections prevent a change in resistivity of said gate and source electrode bus-bars when said gate and source electrode bus-bars are misaligned.

4. The liquid crystal matrix display panel as claimed in claim 1, wherein a dimension of said wider section is determined according to a matching accuracy between adjacent groups during said group photolithography exposure method.

5. A liquid crystal matrix display panel comprising:
a first substrate;
TFT transistors formed on said first substrate;
said TFT transistors being arranged in a matrix, each TFT transistor including a source electrode, a gate electrode and a drain electrode;
picture element electrodes formed on said first substrate, said picture element electrodes being arranged in a matrix, each picture element electrode being connected to a corresponding one of said drain electrodes;
gate electrode bus-bars formed on said first substrate for electrically interconnecting said gate electrodes of said TFT transistors aligned in one direction of said matrix;
source electrode bus-bars formed on said first substrate for electrically interconnecting said source electrodes of said TFT transistors aligned in the other direction of said matrix;
said TFT transistors being divided into a plurality of groups, each group being a sub-matrix of said matrix, said gate electrode bus-bars and said source electrode bus-bars having wider sections at boundaries of said groups, said boundaries being located between respective transistors of adjacent groups;
a second substrate; and
a liquid crystal composition disposed between said first and second substrates;
wherein selected ones of said picture element electrodes have cut-away portions at positions corresponding to said wider sections of said gate electrode bus-bars and said source electrode bus-bars.

6. The liquid crystal matrix display panel as claimed in claim 5, wherein said wider sections provide connecting regions between gate electrode bus-bars of adjacent groups and provide connecting regions between said source electrode bus-bars of adjacent groups.

7. The liquid crystal matrix display panel as claimed in claim 6, wherein said connecting regions form only a single planar interface between like electrode bus-bars of adjacent groups such that said planar interface is parallel to the surface of said first substrate.

8. The liquid crystal matrix display panel as claimed in claim 6, wherein said connecting regions prevent a change in resistivity of said gate and source electrode bus-bars when said gate and source electrode bus-bars are misaligned.

9. A liquid crystal matrix display panel, comprising:
a plurality of X and Y driver electrodes; and
a plurality of picture elements arranged in a matrix on a substrate and connected to said X and Y driver electrodes through thin film switching elements;
said plurality of picture elements and said X and Y driver electrodes being formed on said substrate in groups by a group photolithography exposure method, each group being a sub-matrix of said matrix;
each X and Y electrode including an expanded portion at a boundary of each group to form an electrical connecting region with respective X and Y electrodes of contiguous groups, each expanded portion having a portion which overlaps a portion of an adjacent expanded portion to form said electrical connecting regions.

10. The liquid crystal matrix display panel as claimed in claim 9, wherein said electrical connecting regions form only a single electrical planar interface between like electrodes of contiguous groups such that said planar electrical interface is parallel to the surface of said substrate.

11. The liquid crystal matrix display panel as claimed in claim 9, wherein said electrical connecting regions prevent a change in resistivity along an electrical path formed by interfacing like electrodes when said like electrodes are misaligned.

12. The liquid crystal matrix display panel as claimed in claim 9, wherein a dimension of said expanded portion is determined according to a matching accuracy between adjacent groups during said group photolithography exposure method.

13. A semiconductor device comprising:
a plurality of signal bus-bar electrodes; and
repetitively arranged active elements formed on a substrate and interconnected by said plurality of signal bus-bar electrodes;
said active elements and said plurality of signal bus-bar electrodes being formed on said substrate in groups by a groups photolithography exposure method;
each of said signal bus-bar electrodes including an expanded section provided at a boundary of each group, each expanded section forming electrical connecting regions with like signal bus-bar electrodes of a contiguous group, each expanded section having a portion which overlaps a portion of an adjacent expanded section to form said electrical connecting regions.

14. The semiconductor device as claimed in claim 13, wherein said electrical connecting regions form only a single electrical planar interface between like signal electrodes of contiguous groups such that said planar electrical interface is parallel to the surface of said substrate.

15. The semiconductor device as claimed in claim 13, wherein said electrical connecting regions prevent a change in resistivity along an electrical path formed by interfacing like signal electrodes when said like signal electrodes are misaligned.

16. The semiconductor device as claimed in claim 13, wherein a dimension of said expanded section is determined according to a matching accuracy between adjacent groups during said group photolithography exposure method.

* * * * *